(12) United States Patent
Ko

(10) Patent No.: US 8,492,250 B2
(45) Date of Patent: Jul. 23, 2013

(54) METHOD FOR FABRICATING SEMICONDUCTOR DEVICE

(75) Inventor: Eun-Jung Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/223,609

(22) Filed: Sep. 1, 2011

(65) Prior Publication Data

US 2012/0289046 A1 Nov. 15, 2012

(30) Foreign Application Priority Data

May 13, 2011 (KR) ......................... 10-2011-0045199

(51) Int. Cl.
*C23C 16/24* (2006.01)
(52) U.S. Cl.
USPC ............ 438/488; 257/E21.057; 257/E21.059; 257/E21.12; 438/166; 438/302; 438/486; 438/514; 438/519; 438/522; 438/525; 438/675
(58) Field of Classification Search
USPC ...... 257/E21.057, E21.059, E21.12; 438/166, 438/302, 486, 488, 514, 519, 522, 525, 675
See application file for complete search history.

(56) References Cited

U.S. PATENT DOCUMENTS

| 4,693,759 A | * | 9/1987 | Noguchi et al. | 117/8 |
| 6,403,497 B1 | * | 6/2002 | Oka et al. | 438/770 |
| 6,544,862 B1 | * | 4/2003 | Bryan | 438/455 |
| 2002/0042168 A1 | * | 4/2002 | Yi et al. | 438/150 |

FOREIGN PATENT DOCUMENTS

| JP | 06-252067 | * | 9/1994 |
| JP | 2003-243303 | | 8/2003 |
| KR | 1020020037809 | | 5/2002 |

OTHER PUBLICATIONS

"Sample Heating", Ion Implantation, Heiner and Ingolf, John Wiley and Sons, New York, pp. 114-117, 1986.*
Felch et al., "Sub-Melt laser Annealing Followed by Low Temperature RTP for minimized Diffusion" Ion Implantation Technology Conference, 2000, pp. 167-170.*
Office Action issued by the Korean Intellectual Property Office on Aug. 9, 2012.

* cited by examiner

*Primary Examiner* — Asok K Sarkar
(74) *Attorney, Agent, or Firm* — IP & T Group LLP

(57) ABSTRACT

A method for forming a polysilicon layer includes forming an amorphous silicon layer over a substrate, performing a first thermal treatment of the amorphous silicon layer by performing an implantation with a gas that includes silicon (Si), and performing a second thermal treatment on the thermally treated layer at a temperature higher than a temperature of the first thermal treatment.

18 Claims, 15 Drawing Sheets

SECOND THERMAL TREATMENT

ETCH

METHOD FOR FABRICATING SEMICONDUCTOR DEVICE

CROSS-REFERENCE TO RELATED APPLICATIONS

The present application claims priority of Korean Patent Application No. 10-2011-0045199, filed on May 13, 2011, which is incorporated herein by reference in its entirety.

BACKGROUND

1. Field

Exemplary embodiments of the present invention relate to a semiconductor device fabrication technology, and more particularly, to a method for forming a polysilicon layer and a method for forming buried bit lines.

2. Description of the Related Art

When buried bit lines BBL are used in cells of a vertical transistor structure, two cells may neighbor one buried bit line. For example, for a cell to be driven by a buried bit line, a One-Side Contact (OSC) process in which a contact is formed in any one side of an active region while the other side of the active region is insulated.

In a cell having a vertical transistor structure formed through the one-side contact process, an active region includes a body isolated by trenches and a pillar formed over the body. The buried bit lines BBL fill the trenches between bodies and word lines (or vertical gates) are disposed adjacent to the sidewalls of pillars and extended in a direction crossing the buried bit lines BBL. Channels are formed in a vertical direction using the word lines.

According to the one-side contact process, a portion of any one sidewall of a body, which is an active region, has to be exposed for connection between the active region and a buried bit line BBL. To form the one-side contact, the trenches between the bodies are filled with a gap-fill layer having a step height. As for the gap-fill layer, a polysilicon layer may be used.

However, a seam may occur during the formation of the polysilicon layer due to narrow linewidth of the contact. The occurrence of the seam causes lack of uniformity during an etch-back process where not only a liner oxide layer which is formed for insulation from the buried bit lines BBL but also the substrate under the trenches are damaged and cause formation of active punch in the substrate.

FIGS. 1A and 1B are Transmission Electron Microscopic (TEM) photographs illustrating results of the conventional technology.

FIG. 1A illustrates that the middle of the polysilicon layer is hollow due to occurrences of seam.

FIG. 1B illustrates that the liner oxide layer and the substrate under the trenches are damaged due to the occurrence of seam on the polysilicon layer in FIG. 1A and that an active punch is formed thereby.

Therefore, when the polysilicon layer is formed, the polysilicon layer should be formed without a defect such as a seam.

SUMMARY

An embodiment of the present invention is directed to a method for fabricating a semiconductor device without a defect.

Another embodiment of the present invention is directed to a method for fabricating a semiconductor device in which an active punch is not formed when buried bit lines are formed.

In accordance with an embodiment of the present invention, a method for forming a polysilicon layer includes: forming an amorphous silicon layer over a substrate; performing a first thermal treatment by performing an implantation with a gas including silicon (Si); and performing a second thermal treatment at a temperature higher than a temperature of the first thermal treatment.

In accordance with another embodiment of the present invention, a method for fabricating a semiconductor device includes: forming openings in a substrate; forming an amorphous silicon layer filling the openings; performing a first thermal treatment on the amorphous silicon layer while performing an implantation with a gas that includes silicon (Si); and performing a second thermal treatment on the thermally treated layer at a temperature higher than a temperature of the first thermal treatment.

In accordance with yet another embodiment of the present invention, a method for forming buried bit lines of a semiconductor device includes: forming a plurality of bodies that are isolated from each other by trenches by etching a substrate; forming an amorphous silicon layer filling the bodies; crystallizing the amorphous silicon layer into a polysilicon layer by performing an implantation with a gas that includes silicon (Si) and performing a first thermal treatment; performing a second thermal treatment on the crystallized layer at a temperature higher than a temperature of the first thermal treatment; forming a first gap-fill layer filling a portion of each trench by etching the polysilicon layer; forming a second gap-fill layer over the first gap-fill layer so that the second gap-fill layer is disposed inside the trench to form a protrusion over each body; forming an etch barrier over the substrate including the protrusion; performing a tilt ion implantation over the etch barrier; selectively removing a portion of the etch barrier that is not ion-implanted; and forming openings that each open one sidewall of a respective body.

DETAILED DESCRIPTION

Figure 1A:
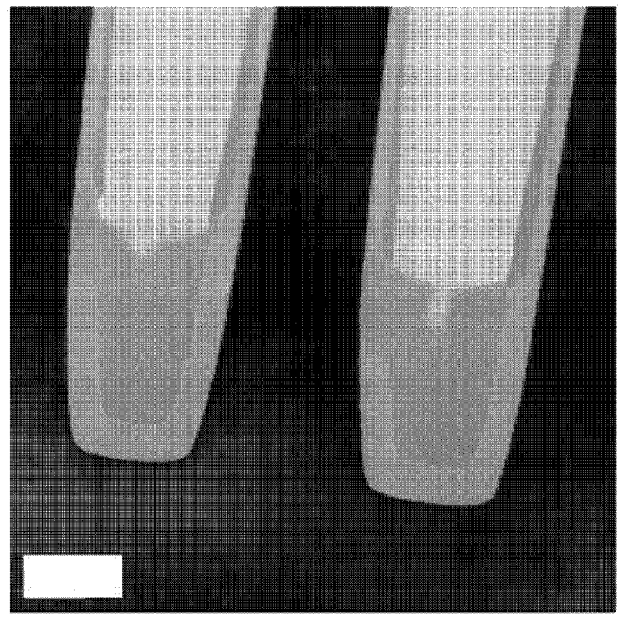
FIGS. 1A and 1B are Transmission Electron Microscopic (TEM) photographs showing the problems of conventional technology.
Figure 1B:
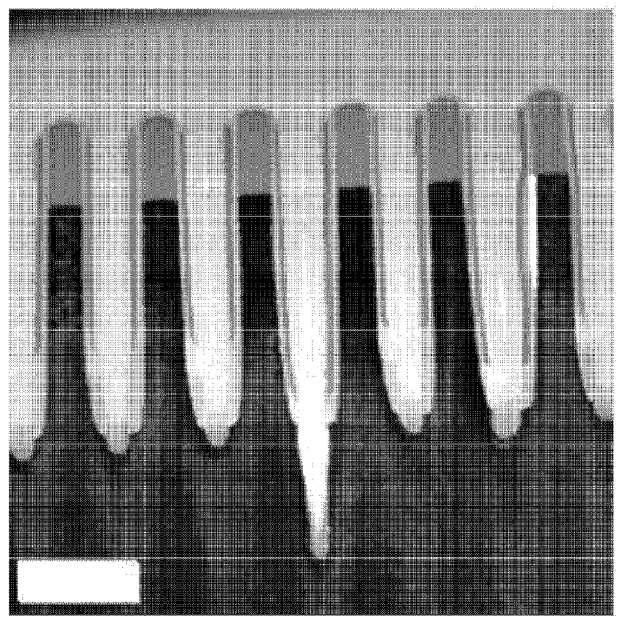

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
FIGS. 2A to 2C are cross-sectional views illustrating a method for forming a polysilicon layer over a plane in accordance with an embodiment of the present invention.
Figure 2A:
Figure 2B:
Figure 2B:
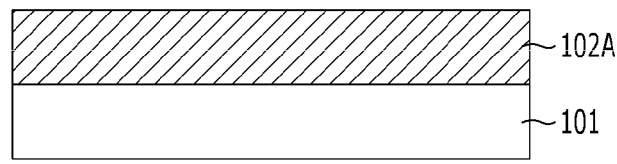
Figure 2C:
Figure 2C:
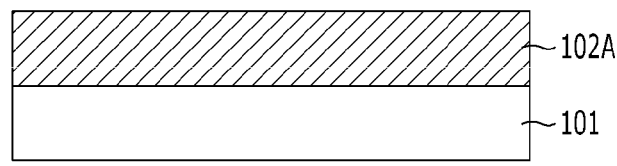

FIGS. 2A to 2C are cross-sectional views illustrating a method for forming a polysilicon layer over a plane in accordance with an embodiment of the present invention.

Referring to FIG. 2A, an amorphous silicon layer 102 is formed over a substrate 101. The amorphous silicon layer 102 is formed at a low temperature to control the deposition rate thereof, where the low temperature tends to decrease the deposition rate. The amorphous silicon layer 102 may be formed at a temperature of approximately 300° C. to approximately 500° C.

Referring to FIG. 2B, a first thermal treatment is performed to crystallize the amorphous silicon layer 102 into a polysilicon layer 102A. Here, the first thermal treatment is performed while performing implantation using silane ($SiH_4$) gas.

The first thermal treatment is performed to crystallize the amorphous silicon layer 102 (see FIG. 2A) into a polysilicon layer 102A, where the amorphous silicon layer 102 is treated at the same temperature as the temperature set for the deposition of the amorphous silicon layer 102, which ranges from approximately 300° C. to approximately 500° C., for approximately 30 minutes to approximately 3 hours. Here, when the first thermal treatment is performed where an implantation with silane ($SiH_4$) gas is performed, silicon elements penetrate into the fine pores generated during the crystallization so as to improve the crystallization quality. Also, as hydrogen (H) and oxygen in the atmosphere react with each other, surface oxidation that may occur otherwise may be prevented during the crystallization.

Referring to FIG. 2C, a second thermal treatment is performed. The second thermal treatment is performed to improve the stability of the polysilicon layer 102A, which was obtained from the crystallization performed through the first thermal treatment, where the polysilicon layer 102A is treated at a temperature ranging from approximately 600° C. to approximately 800° C. for approximately 20 minutes to approximately 1 hour. During the second thermal treatment, various byproducts may be evaporated for removal, and the bonding between the silicon elements filling the fine pores during the first thermal treatment and the polysilicon layer 102A may be stabilized.

As described above, deposition profile of the amorphous polysilicon layer 102 may be improved by forming the amorphous polysilicon layer 102 at a low temperature to decrease the deposition rate, and the layer quality is improved through the first thermal treatment using silane ($SiH_4$) gas and the second thermal treatment that is performed at a higher temperature than that of the first thermal treatment. In this way, the polysilicon layer 102A preventing the formation of fine pores may be prevented.

FIGS. 3A to 3D are cross-sectional views illustrating a method for forming a polysilicon layer inside a contact in accordance with an embodiment of the present invention.

Figure 3A:
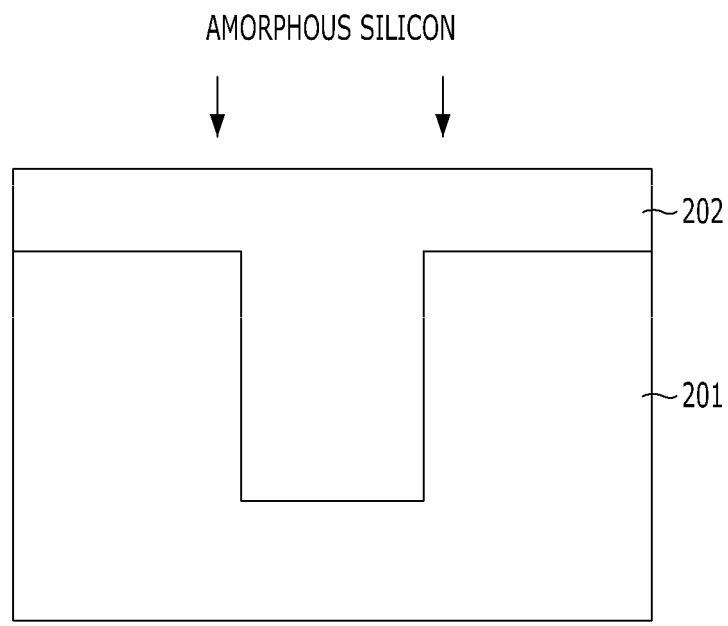
FIGS. 3A to 3D are cross-sectional views illustrating a method for forming a polysilicon layer in a contact in accordance with an embodiment of the present invention.

Referring to FIG. 3A, an amorphous silicon layer 202 filling a contact of a desired depth is formed over a substrate 201 which includes the contact. The amorphous silicon layer 202 is formed at a low temperature to control the deposition rate, that is, to decrease the deposition rate. The amorphous silicon layer 202 may be formed at a temperature ranging from approximately 300° C. to approximately 500° C.

When the amorphous silicon layer 202 is formed at a low deposition rate at the temperature of approximately 300° C. to approximately 500°, deposition profile thereof is improved to thereby prevent seam or void from being formed. On the other hand, when the amorphous silicon layer 202 is formed at a temperature of approximately 600° C. or higher, the amorphous silicon layer 202 may be crystallized into a polysilicon layer as soon as it is deposited and a seam or void may be formed as the fast crystallization promotes clogging up an opening of the contact. However, according to an example, by depositing he amorphous silicon layer 202 at a temperature ranging from approximately 300° C. to approximately 500° C., quick crystallization and the formation of a seam or void are prevented.

Figure 3B:
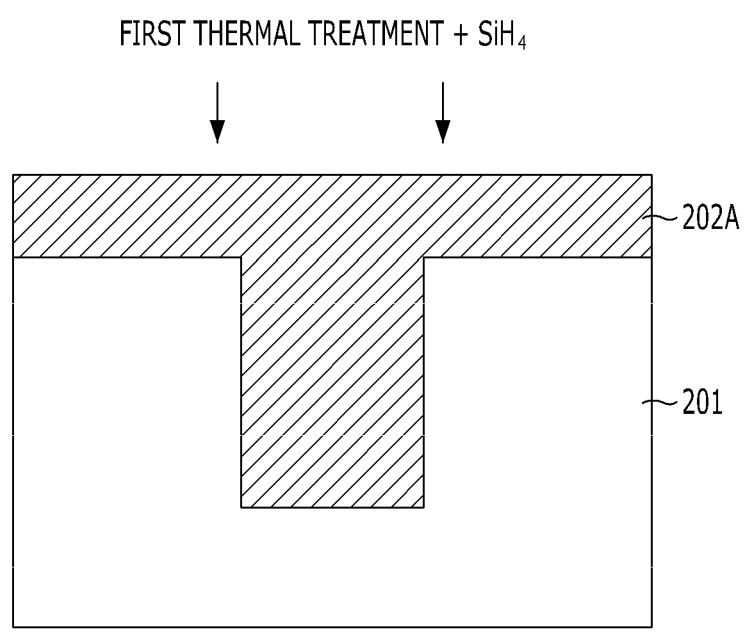

Referring to FIG. 3B, a first thermal treatment is performed to crystallize the amorphous silicon layer 202 into a polysilicon layer 202A. Here, the first thermal treatment is performed by performing an implantation with silane ($SiH_4$) gas.

The first thermal treatment is performed to crystallize the amorphous silicon layer 202 (see FIG. 2A) into a polysilicon layer 202A, where the amorphous silicon layer 202 is treated at the same temperature as the temperature set for the deposition of the amorphous silicon layer 202, which ranges from approximately 300° C. to approximately 500° C., for approximately 30 minutes to approximately 3 hours. Here, when the first thermal treatment is performed by performing an implantation with silane ($SiH_4$) gas, the formation of a gap or defect caused by grain growth may be prevented. Also, silicon elements penetrate into the fine pores formed during the crystallization so as to improve the crystallization quality. Also, as hydrogen (H) and oxygen in the atmosphere react with each other, surface oxidation that may occur otherwise during the crystallization may be prevented.

Figure 3C:
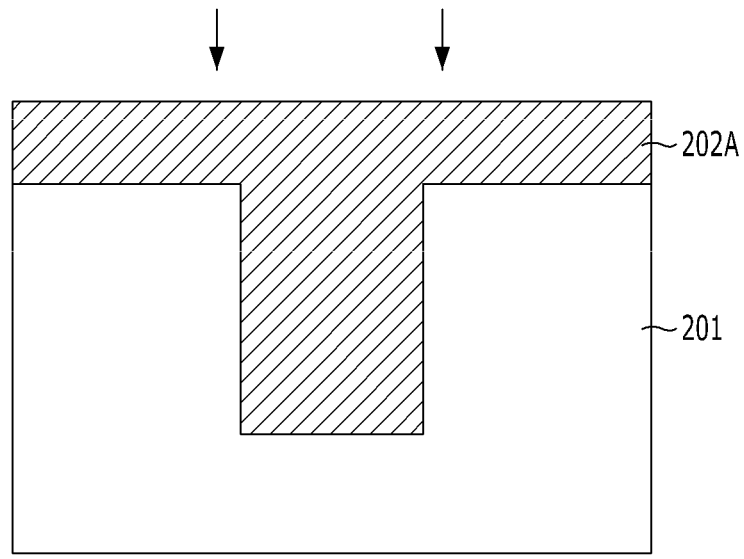

Referring to FIG. 3C, a second thermal treatment is performed. The second thermal treatment is performed to improve the stability of the polysilicon layer 202A, which was obtained from the crystallization performed through the first thermal treatment, and the second thermal treatment is performed at a temperature ranging from approximately 600° C. to approximately 800° C. for approximately 20 minutes to approximately 1 hour. During the second thermal treatment, various byproducts are evaporated for being removed, and the bonding between the silicon elements filling the fine pores during the first thermal treatment and the polysilicon layer 202A may be stabilized.

As described above, a deposition profile of the amorphous polysilicon layer 202 may be improved by forming the amorphous polysilicon layer 202 at a low temperature to decrease the deposition rate, and the layer quality is improved through the first thermal treatment using silane ($SiH_4$) gas and the second thermal treatment that is performed at a higher temperature than that of the first thermal treatment. In this way, the polysilicon layer 202A where the formation of fine pores is prevented may be formed.

Figure 3D:
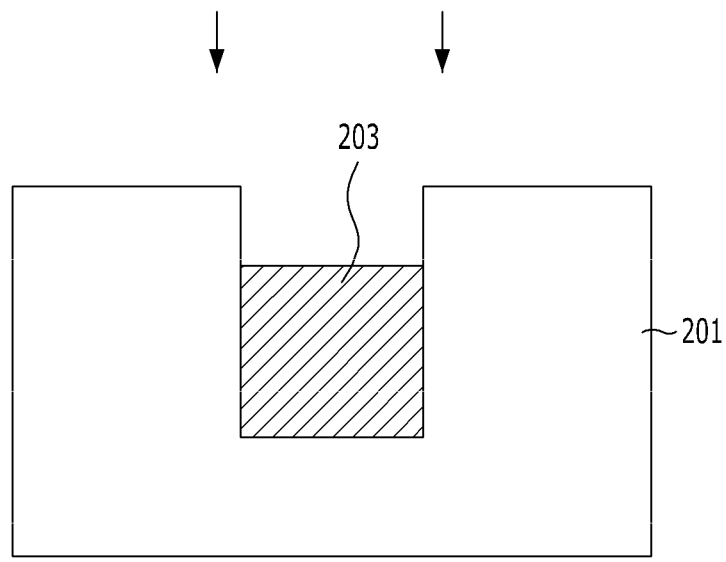

Referring to FIG. 3D, the polysilicon layer 202A is etched to partially fill a contact. To this end, the surface of the substrate 201 is targeted for a planarization process, and then an etch-back process is performed so that the polysilicon layer 202A fills a portion of the contact. Here, the planarization process may be a Chemical Mechanical Polishing (CMP) process.

The method for forming the seam-free or void-free polysilicon layer in the contact may be applied to diverse such as forming contact plugs or buried bit lines. According to an exemplary embodiment of the present invention, the method for forming the seam-free or void-free polysilicon layer is applied to a method for forming buried bit lines.

FIGS. 4A to 4M are cross-sectional views illustrating a method for forming buried bit lines over a plane in accordance with an embodiment of the present invention.

Figure 4A:
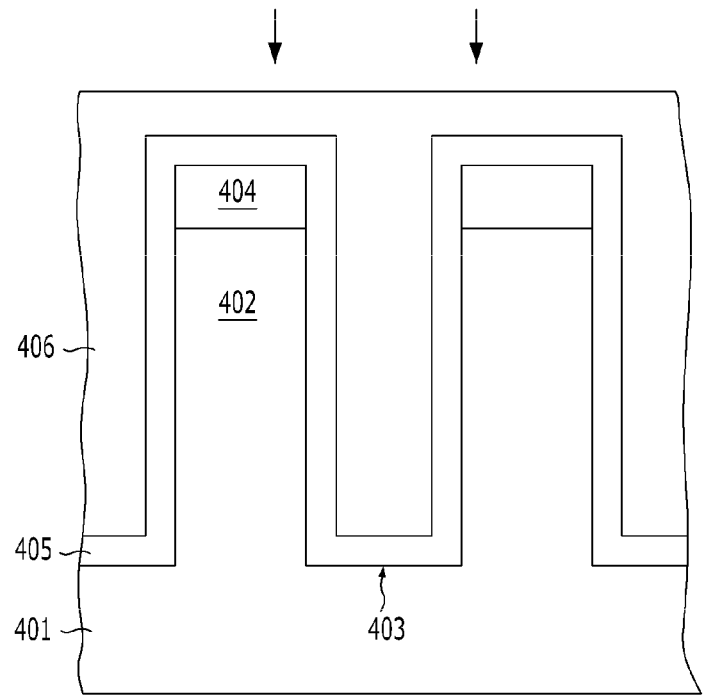
FIGS. 4A to 4M are cross-sectional views illustrating a method for forming buried bit lines over a plane in accordance with an embodiment of the present invention.

Referring to FIG. 4A, bodies 402 are formed by a hard mask layer pattern 404 as an etch barrier and etching a substrate 401. The bodies 402 are isolated from each other by trenches 403. A liner oxide layer 405 is formed as an insulation layer over the substrate structure including the bodies 402. The liner oxide layer 405 includes an oxide layer such as a silicon oxide layer.

An amorphous silicon layer 406 gap-filling the trenches 403 is formed over the liner oxide layer 405. The amorphous silicon layer 406 is used as a gap-fill layer for forming an opening that opens a portion of a sidewall of a body subsequently. The amorphous silicon layer 406 may be formed free of seam and may form an opening at a desired position and protect the substrate 401 from being damaged in a subsequent etch-back process.

To this end, the amorphous silicon layer 406 is formed at a low temperature to control the deposition rate, that is, to decrease the deposition rate. The amorphous silicon layer 406 may be formed at a temperature ranging from approximately 300° C. to approximately 500° C.

When the amorphous silicon layer 406 is formed at a low deposition rate at a temperature of approximately 300° C. to approximately 500° C., deposition profile thereof is improved so as to prevent an occurrence of a seam or void. On the other hand, when the amorphous silicon layer 406 is deposited at a temperature higher than approximately 600° C., it may be crystallized as soon as it is deposited, where the fast crystallization may promote clogging up of an opening of a contact. However, according to an example, by depositing the amorphous silicon layer 406 at a temperature of approximately 300° C. to approximately 500° C., the quick crystallization and the formation of a seam or void are prevented.

Figure 4B:
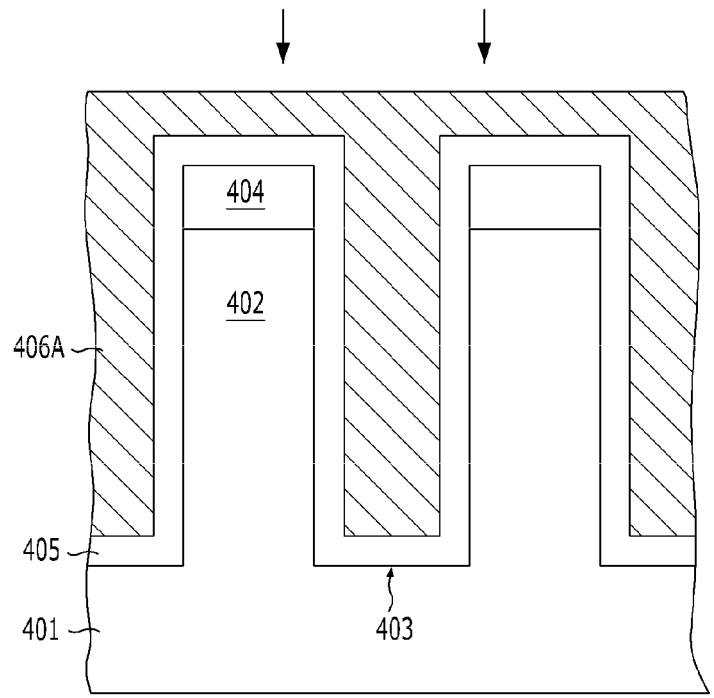

Referring to FIG. 4B, a first thermal treatment is performed to crystallize the amorphous silicon layer 406 into a polysilicon layer 406A. Here, the first thermal treatment is performed by performing an implantation with silane (SiH$_4$) gas.

In crystallizing the amorphous silicon layer 406 (see FIG. 4A) into a polysilicon layer 406A, the first thermal treatment is performed at the same temperature that the amorphous silicon layer 406 is deposited, which is between approximately 300° C. and approximately 500° C., for approximately 30 minutes to approximately 3 hours. Here, when the first thermal treatment is performed by performing an implantation with silane (SiH$_4$) gas, the formation of a gap or defect caused from grain growth may be prevented due to the implantation of silicon. Also, as the silicon elements penetrate into fine pores formed during the crystallization, the crystallization quality may be improved, and when the hydrogen (H) and oxygen in the atmosphere react with each other, surface oxidation that may be caused during the crystallization may be prevented.

Figure 4C:
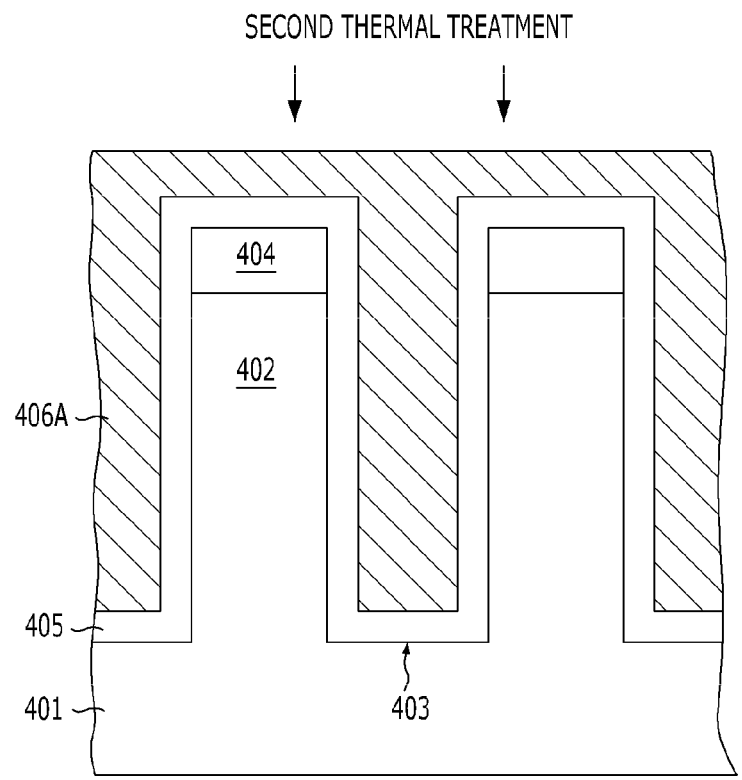

Referring to FIG. 4C, a second thermal treatment is performed. The second thermal treatment is performed to improve the stability of the polysilicon layer 406A which is obtained from the crystallization through the first thermal treatment. The second thermal treatment is performed at a temperature of approximately 600° C. to approximately 800° C. for approximately 2 minutes to approximately 1 hour. Diverse byproducts are evaporated and removed through the second thermal treatment, and the bond between the silicon elements implanted during the first thermal treatment and the polysilicon layer 406A may be stabilized.

As described above, the deposition profile of the amorphous silicon layer 406 is improved by forming the amorphous silicon layer 406 at a low temperature and decreasing the deposition rate, and the layer quality is improved as well through the first thermal treatment using silane (SiH$_4$) gas and the second thermal treatment that is performed at a higher temperature than the first thermal treatment. Also, the seam or void-free polysilicon layer 406A may be formed. This will be described in detail in reference to the Transmission Electron Microscopic (TEM) photographs of FIGS. 5A and 5B.

Figure 4D:
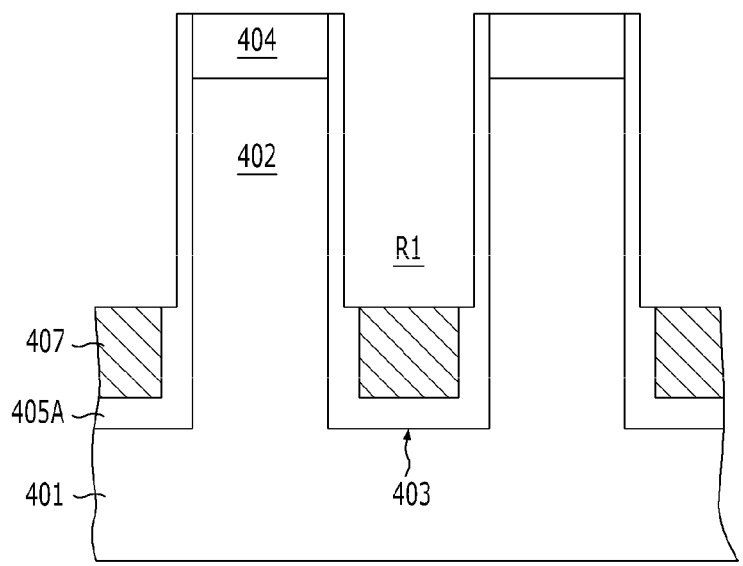

Referring to FIG. 4D, a first gap-fill layer pattern 407 is formed by etching the polysilicon layer 406A to fill a portion of a contact. To this end, a planarization is performed targeting the surface of the hard mask layer pattern 404, and then an etch-back process is performed so that the polysilicon layer 406A fills a portion of a contact. The planarization may be a Chemical Mechanical Polishing (CMP) process.

After the etch-back process, the first gap-fill layer pattern 407 provides a first recess R1. During the CMP process, the liner oxide layer 405 over the hard mask layer pattern 404 may be polished out. In polishing out the liner oxide layer 405 over the hard mask layer pattern 404, the hard mask layer pattern 404 and a liner oxide layer pattern 405A covering both sidewalls of each trench 403 remain. The liner oxide layer pattern 405A also covers the bottom of each trench 403.

Subsequently, the liner oxide layer pattern 405A is thinned through a wet etch process. Therefore, the liner oxide layer pattern 405A remaining on the sidewalls of the first recess R1 becomes thinner than the liner oxide layer pattern 405A surrounding/covering the first gap-fill layer pattern 407.

Figure 4E:
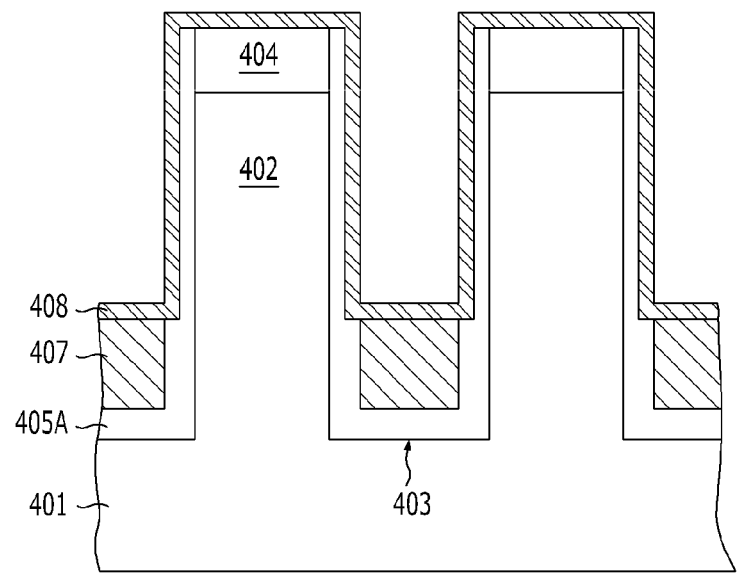

Referring to FIG. 4E, a liner nitride layer 408 is formed over the substrate structure including the first gap-fill layer pattern 407 as an insulation layer. The liner nitride layer 408 includes a nitride layer such as a silicon nitride layer.

Figure 4F:
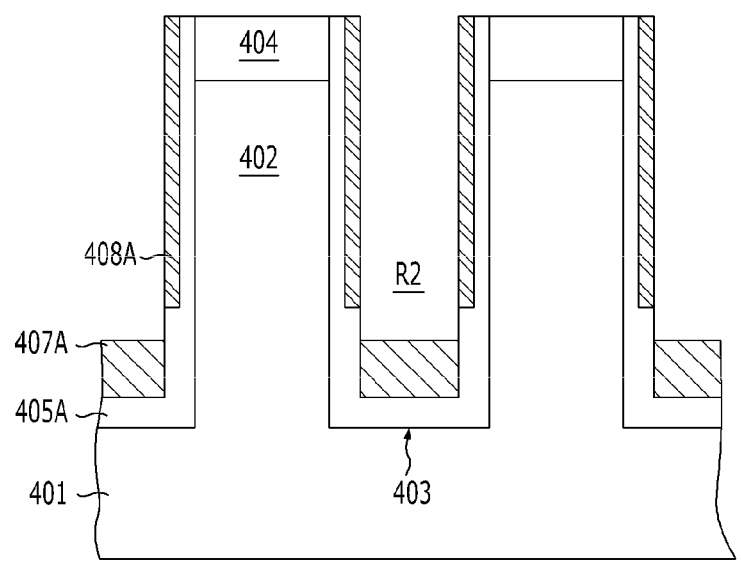

Referring to FIG. 4F, the liner nitride layer 408 is etched. As a result, a liner nitride layer pattern 408A is formed. Subsequently, the first gap-fill layer pattern 407 is recessed to a desired depth by using the liner nitride layer pattern 408A as an etch barrier. As a result, a second recess R2 is formed. The first gap-fill layer pattern with the second recess R2 formed therein is denoted with a reference numeral '407A.'

As the first gap-fill layer pattern 407A with the second recess

R2 is recessed due to the formation of the second recess R2, the liner oxide layer pattern 405A is exposed between the liner nitride layer pattern 408A and the first gap-fill layer pattern 407A with the second recess R2.

Figure 4G:
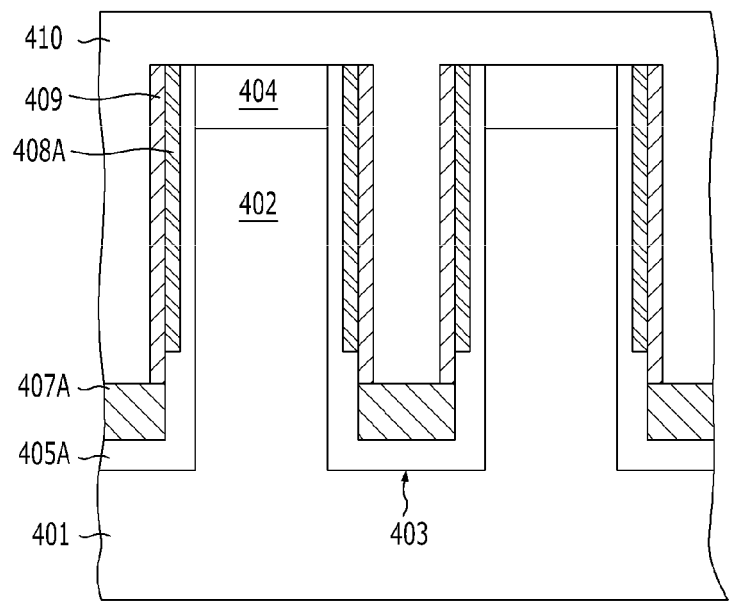

Referring to FIG. 4G, a metal nitride layer is formed conformally over the substrate structure including the second recess R2. Subsequently, spacers 409 are formed by performing a spacer etch process. The spacers 409 are formed on both sidewalls of each body 402, that is, both sidewalls of the second recess R2. The spacers 409 may include a titanium nitride layer (TiN).

A second gap-fill layer 410 is formed to gap-fill the second recess R2 where the spacers 409 are formed. The second gap-fill layer 410 includes an oxide layer. The second gap-fill layer 410 includes a Spin-On Dielectric (SOD) layer.

Figure 4H:
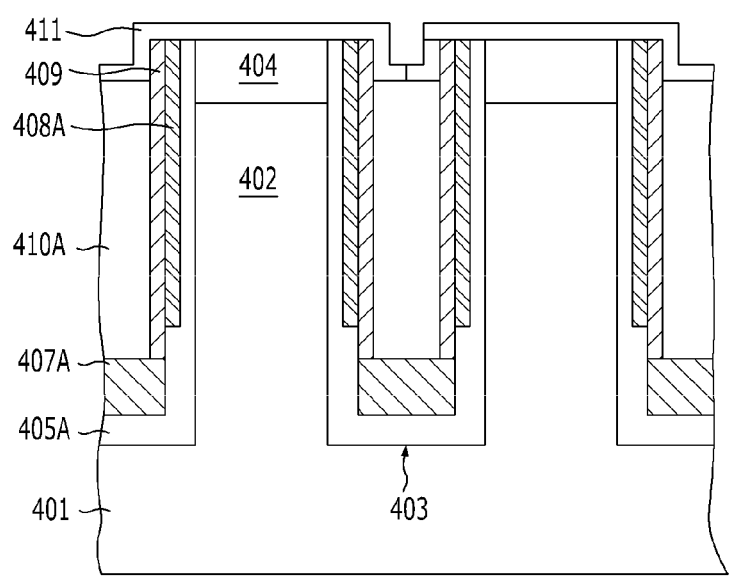

Referring to FIG. 4H, after the second gap-fill layer 410 is planarized, the second gap-fill layer 410 is etched back. As a result, a recessed second gap-fill layer pattern 410A is formed.

Subsequently, an etch barrier 411 is formed over the substrate structure including the second gap-fill layer pattern 410A. The etch barrier 411 includes an undoped polysilicon layer.

Figure 4I:
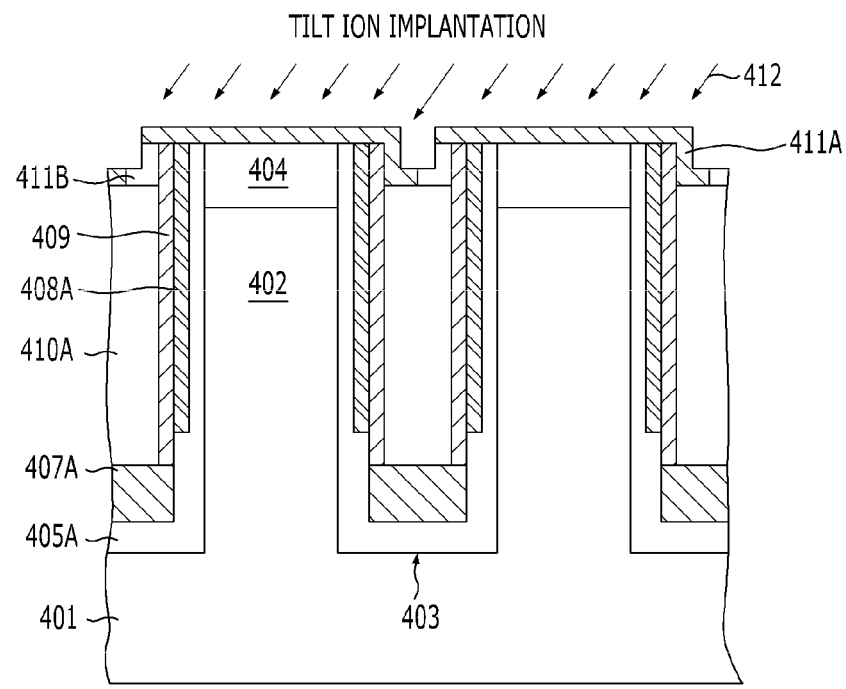

Referring to FIG. 4I, a tilt ion implantation process 412 is performed. The tilt ion implantation process 412 is a process of implanting ions of a dopant at a desired angle. Here, the amount of energy is controlled to implant the dopant into a portion of the etch barrier 411.

The tilt ion implantation process 412 is performed at a desired angle, which ranges from approximately 5° to approximately 30°. A portion of ion beam is shadowed by the hard mask layer pattern 404. Therefore, a portion of the etch barrier 411 is doped and the other portion of the etch barrier 411 remains undoped. For example, the ion-implanted dopant may be a P-type dopant. More specifically, the ion-implanted dopant may be boron, and a dopant source used for ion-implanting boron may be boron fluorine ($BF_2$). As a result, a portion of the etch barrier 411 remains undoped. The portion remaining undoped is a portion adjacent to the left side of the hard mask layer pattern 404.

The portion formed on the upper surface of the hard mask layer pattern 404 of the etch barrier 411 through the tilt ion implantation process 412 of the dopant and the portion adjacent to the right side of the hard mask layer pattern 404 become a doped etch barrier 411A, which is doped with the dopant. The etch barrier 411 which is not implanted with the dopant becomes an undoped etch barrier 411B.

Figure 4J:
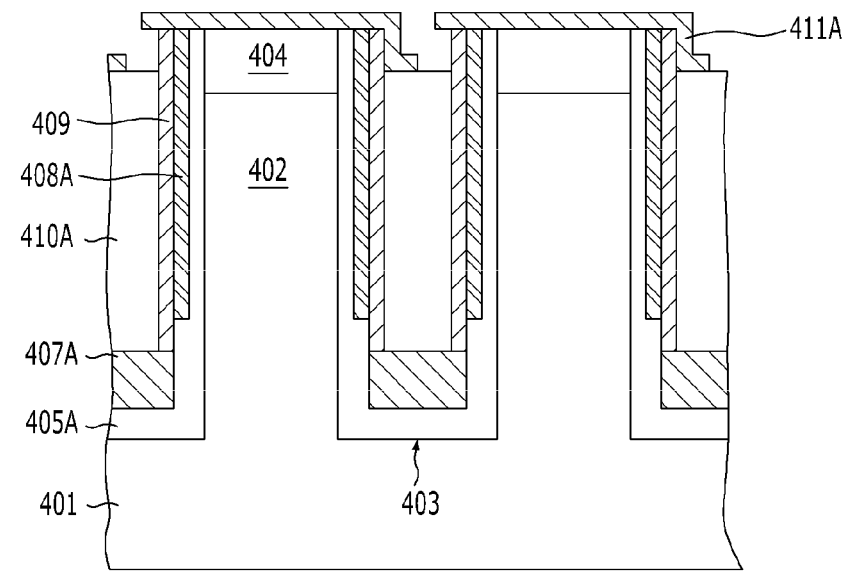

Referring to FIG. 4J, the undoped etch barrier 411B is removed. Here, the polysilicon used as an etch barrier has different etch rate according to whether the portion is doped with the dopant or not. Particularly, the undoped polysilicon which is not implanted with the dopant has a fast wet etch rate. Therefore, the undoped etch barrier 411B may be removed through a wet etch process or a wet cleaning process by using a chemical which has a high etch selectivity and is capable of wet-etching the undoped polysilicon.

When the undoped etch barrier 411B is removed as described above, the doped etch barrier 411A remains.

Figure 4K:
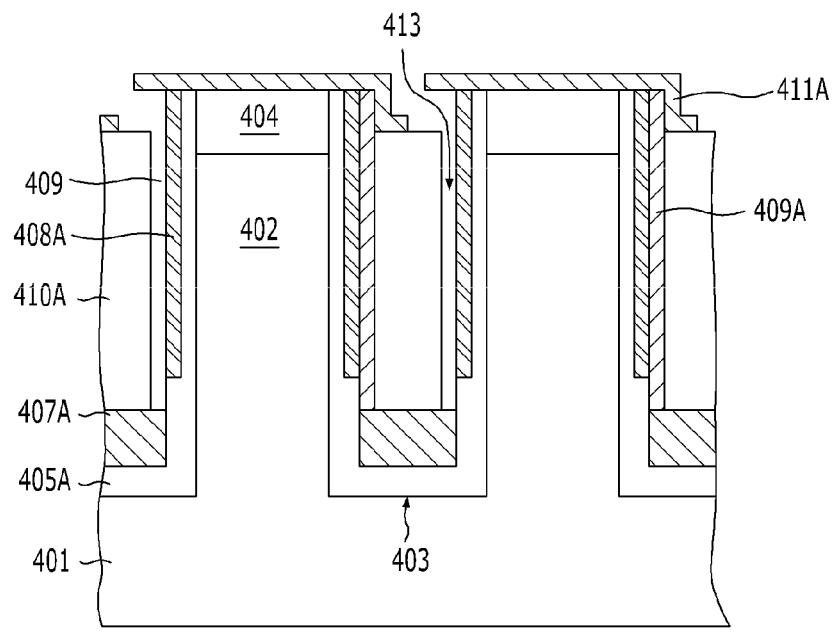

Referring to FIG. 4K, one of the spacers 409 is removed. More specifically, the spacer 409 between the doped etch barrier 411A is removed. As a result, a gap 413 is formed. The spacer is removed through a wet etch process. As a result, one spacer 409A in the opposite side remains.

Figure 4L:
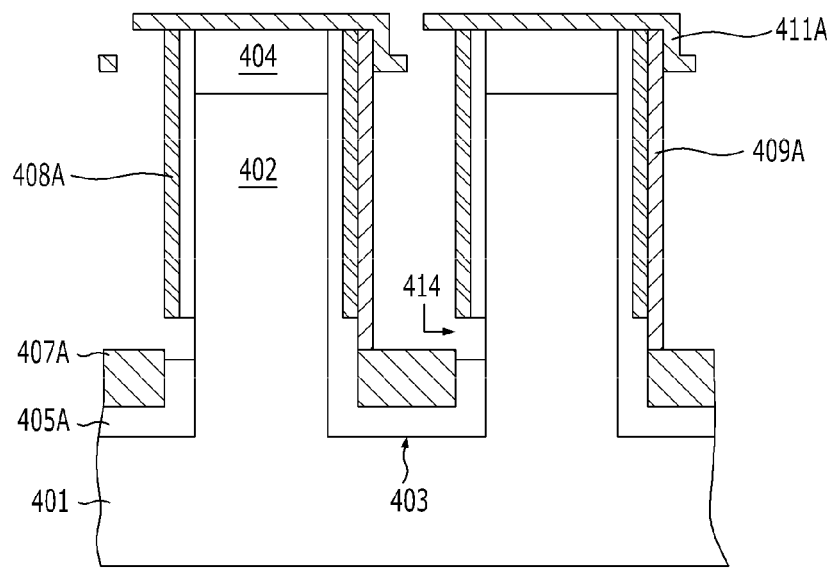

Referring to FIG. 4L, a cleaning process is performed to expose a portion of any one sidewall of each body 402.

The cleaning process includes a wet cleaning process. A wet cleaning process is performed using hydrofluoride (HF), buffered oxide etchant (BOE) and the like. When the wet cleaning process is performed, a portion of the liner oxide layer pattern 405A is removed so as to form an opening 414 that exposes the body 402. When the opening 414 is formed, the second gap-fill layer pattern 410A is removed together.

As described above, the hard mask layer pattern 404, the liner oxide layer pattern 405A, and the liner nitride layer pattern 408A are collectively referred to as an insulation layer. Here, the insulation layer provides the opening 414 that exposes a portion of any one sidewall of each body 402.

Figure 4M:
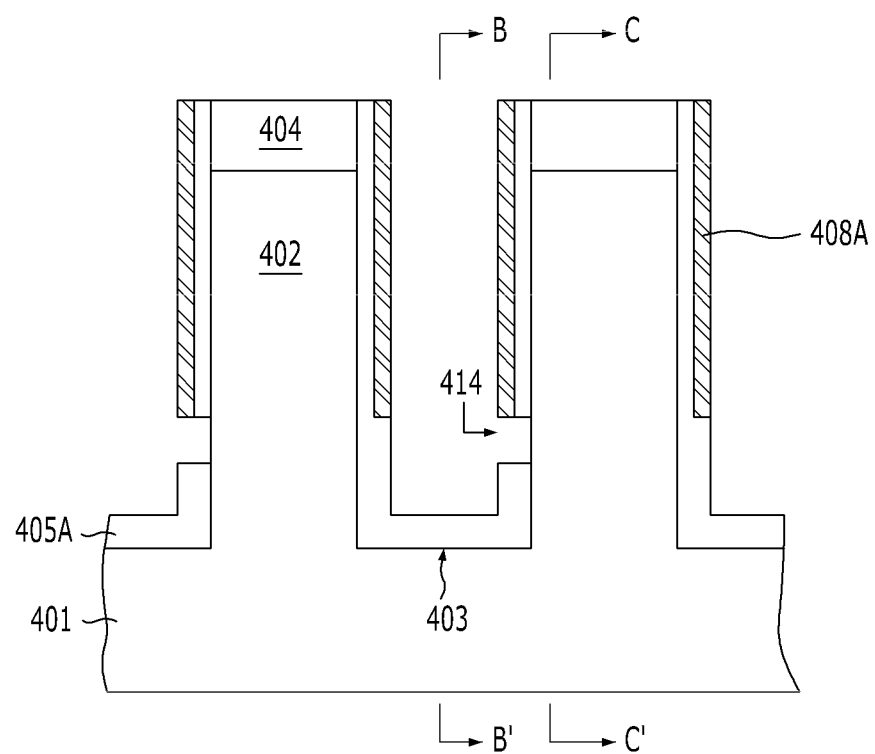

Referring to FIG. 4M, the remaining spacer 409A and the doped etch barrier 411A are removed. When the doped etch barrier 411A is removed, the first gap-fill layer pattern 407A with the second recess R2 is removed together.

Subsequently, a junction region is formed on the portion of a sidewall of the body exposed by the opening 414, and buried bit lines are formed to fill a portion of each trench 403 as coupled with the junction region. Also, a bit line protective layer and an inter-layer dielectric layer may be formed over the buried bit lines, which will be described in detail later with reference to FIGS. 6A to 6E.

Figure 5A:
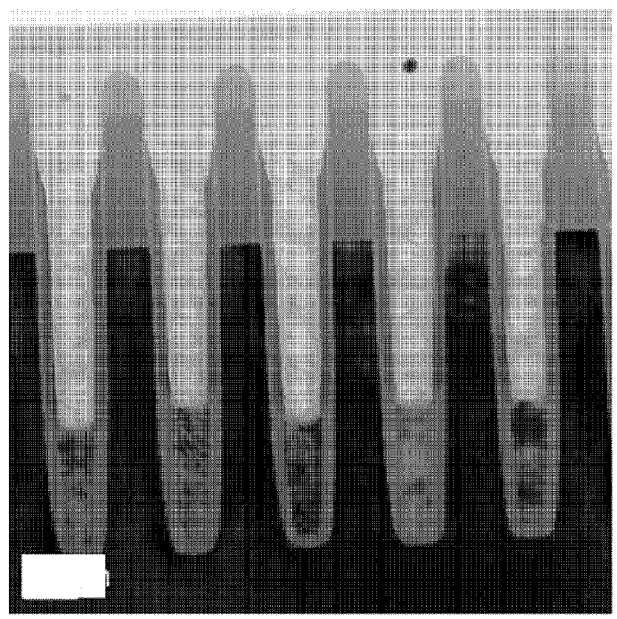
FIGS. 5A and 5B are Transmission Electron Microscopic (TEM) photographs showing a polysilicon layer formed in accordance with an embodiment of the present invention.
Figure 5B:
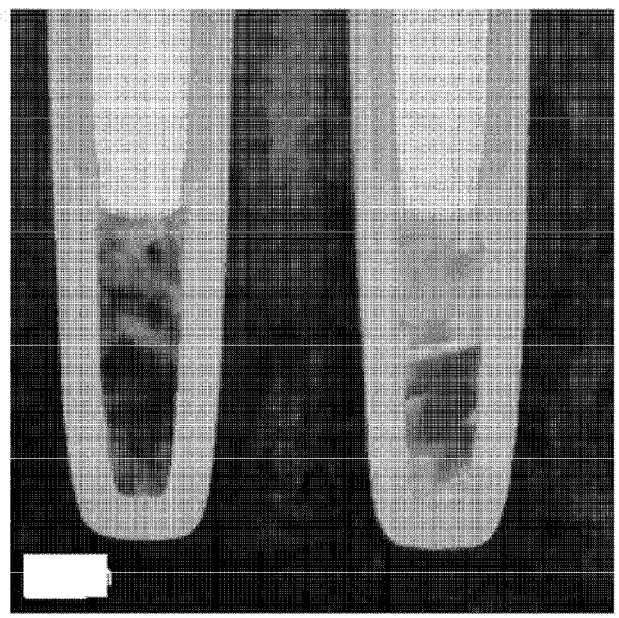

FIGS. 5A and 5B are Transmission Electron Microscopic (TEM) photographs showing a polysilicon layer formed in accordance with an embodiment of the present invention.

Referring to FIGS. 5A and 5B, it may be seen that when the polysilicon layer, that is, the first gap-fill layer pattern obtained from the etch-back process is formed, a seam or void does not occur and the liner oxide layer and the substrate are not damaged.

FIGS. 6A to 6E are cross-sectional views illustrating a process after the formation of buried bit lines. FIGS. 6A to 6E simultaneously show the cross sections of the FIG. 4M structure after forming buried bit lines along lines B-B' and C-C'.

Figure 6A:
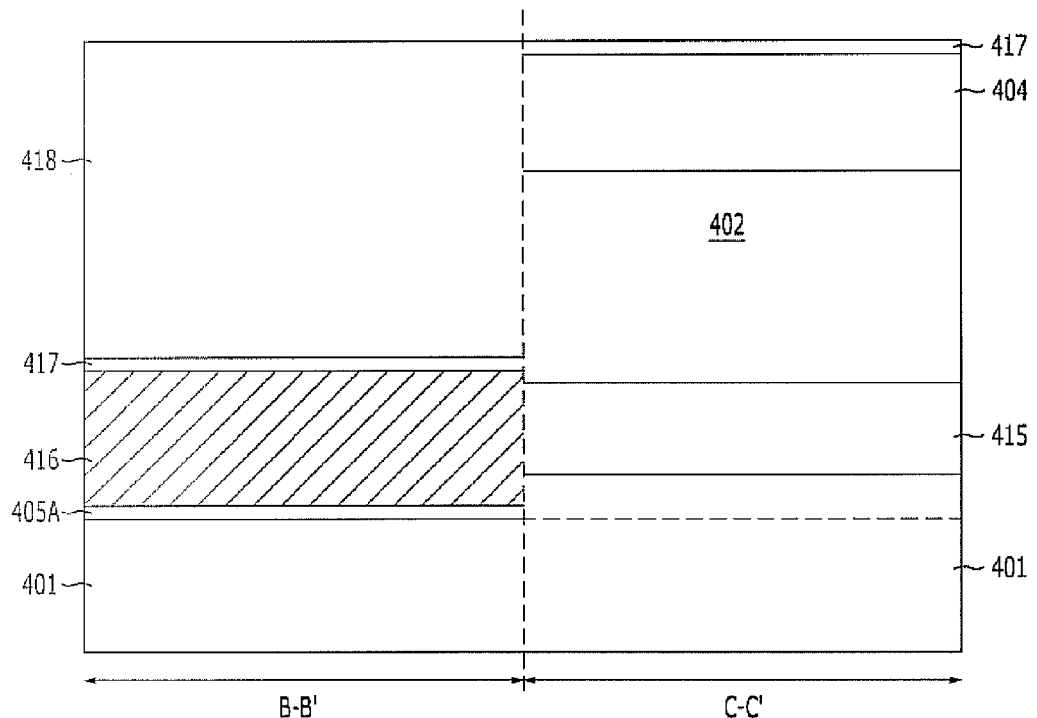
FIGS. 6A to 6E are cross-sectional views illustrating a process after the formation of buried bit lines.

Referring to FIG. 6A, buried bit lines 416 filling a portion of each trench 403 are formed over the liner oxide layer pattern 405A, and a bit line protective layer 417 is formed along the profile of the entire structure including the buried bit lines 416. Subsequently, a first inter-layer dielectric layer 418 is formed over the substrate structure including the bit line protective layer 417. Subsequently, the first inter-layer dielectric layer 418 is planarized until the surface of the hard mask layer pattern 404 is exposed.

Figure 6B:
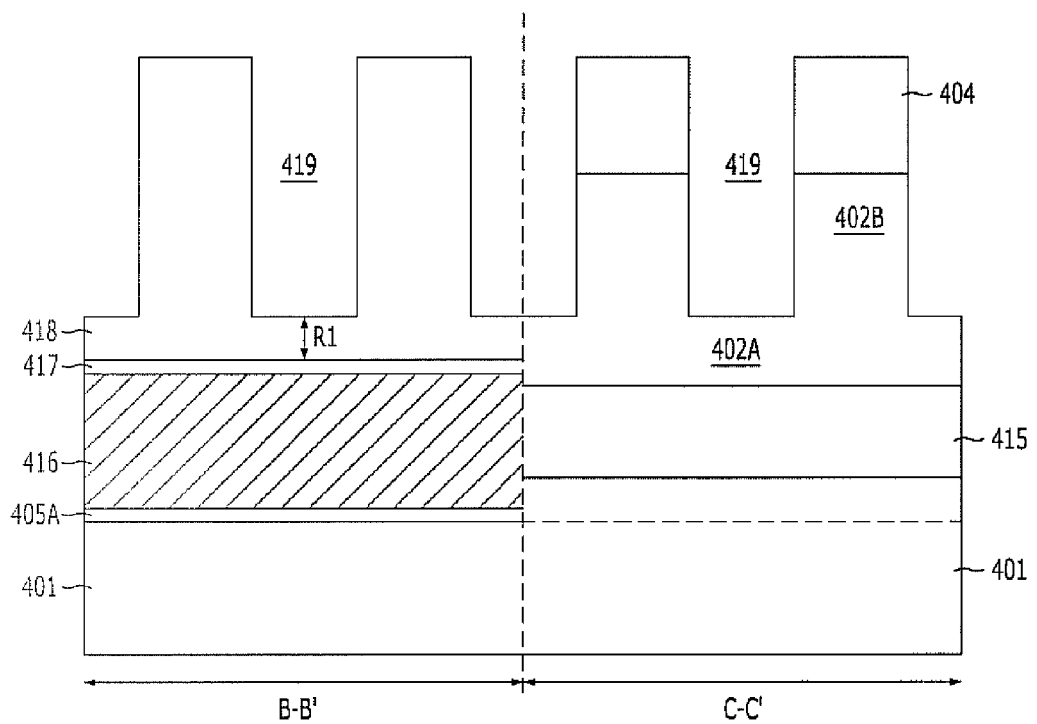

Referring to FIG. 6B, word line trenches 419 are formed. To form the word line trenches 419, a photoresist layer pattern, which is not shown in the drawing, is used. The first inter-layer dielectric layer 418 is etched to a desired depth by using the photoresist pattern as an etch barrier. When the first inter-layer dielectric layer 418 is etched, the hard mask layer pattern 404 and the bodies 402 are etched to a desired depth as well. As a result, pillars 402B are formed over the etched bodies 402A. The etched bodies 402A and the pillars 402B become active regions. The etched bodies 402A are portions where junction regions 415 are formed. The etched bodies 402A have a shape of lines extended in the same direction as the buried bit lines 416. The pillars 402B are formed over the etched bodies 402A to be extended vertically. The pillars 402B are formed for respective cells. The remaining first inter-layer dielectric layer 418 having a thickness R1 serves as an isolation layer between the buried bit lines 416 and vertical word lines.

Figure 6C:
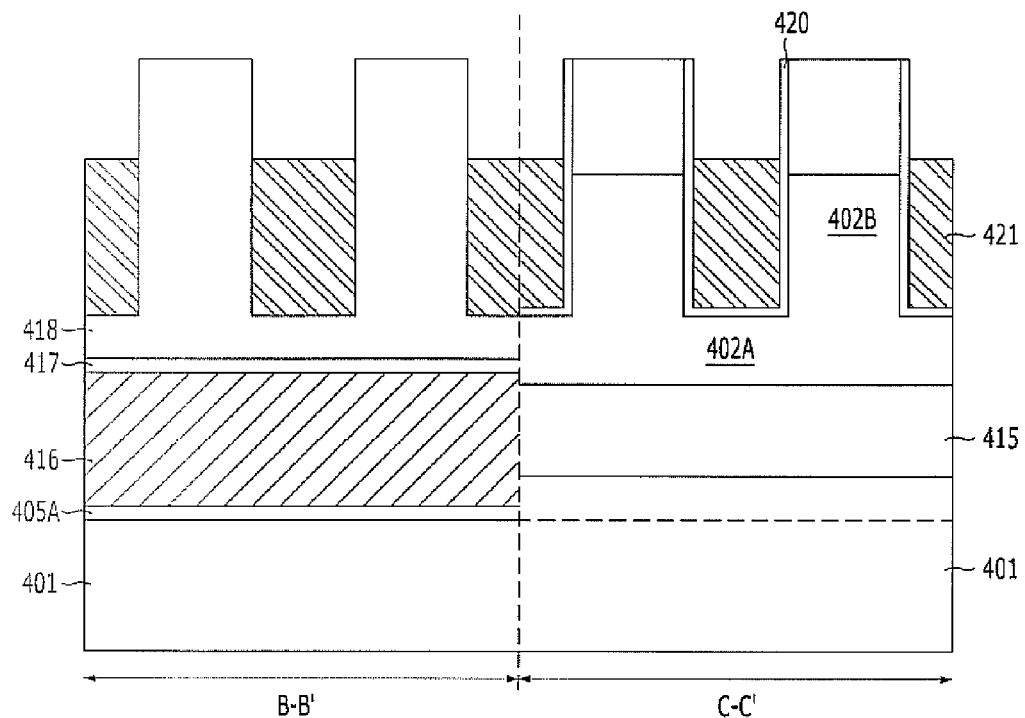

Referring to FIG. 6C, a word line conductive layer 421 is formed to gap-fill the word line trenches 419 (see FIG. 6B). subsequently, a planarization process and an etch-back process are performed until the word line conductive layer 421 remains at a height gap-filling a portion of each word line trench 419. A gate insulation layer 420 is formed before the word line conductive layer 421 is formed.

Figure 6D:
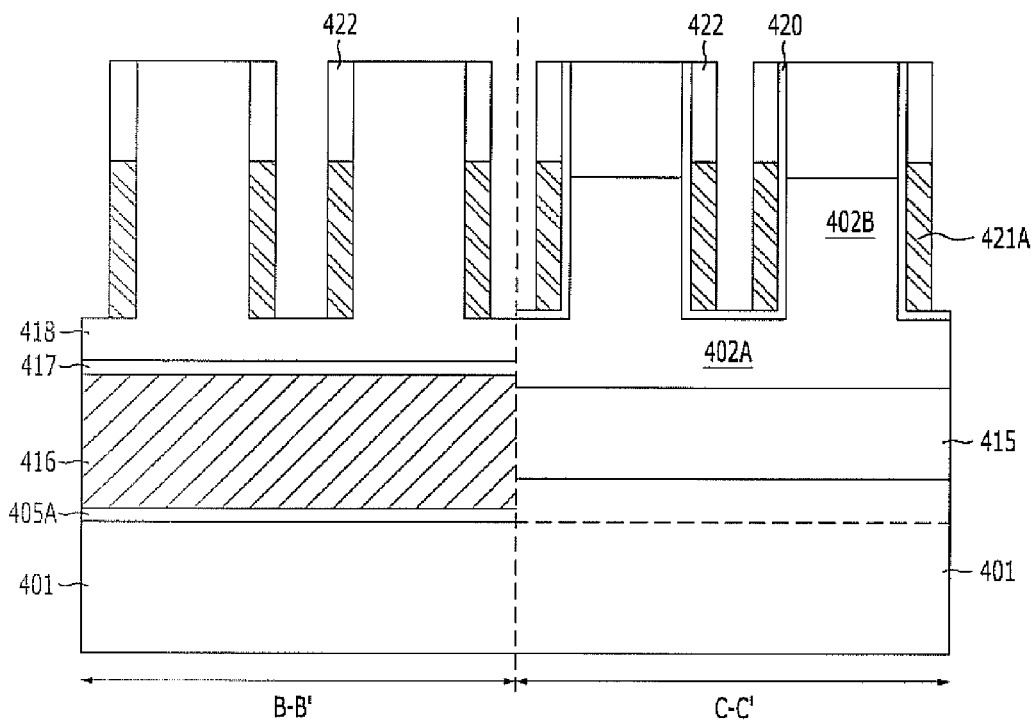

Referring to FIG. 6D, spacers 422 are formed by performing an etch-back process after a nitride layer is deposited. The word line conductive layer 421 is etched using the spacers 422 as etch barriers. As a result, vertical word lines 421A are formed adjacent to the sidewalls of the pillars 402B. The vertical word lines 421A also serve as vertical gates. According to another embodiment of the present invention, the vertical word lines 421A may be formed to couple neighboring vertical gates with each other after circular vertical gates surrounding each pillar 402B are formed. The vertical word lines 421A are formed in a direction crossing the buried bit lines 416.

Figure 6E:
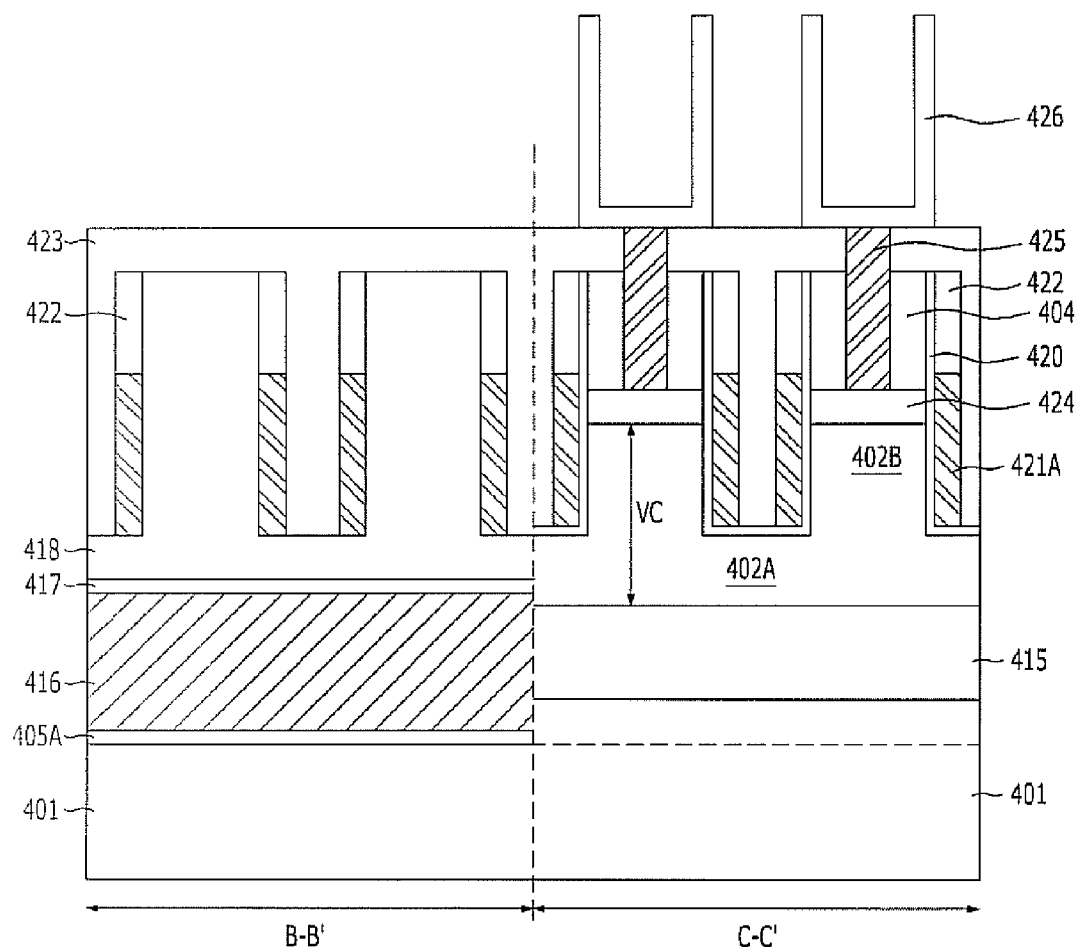

Referring to FIG. 6E, a second inter-layer dielectric layer 423 is formed over the substrate structure including the vertical word lines 421A.

The upper portion of each pillar 402B is exposed by performing a storage node contact etch process. As a result, storage node contact plugs (SNC) 425 are formed. Drains 424 may be formed by performing an ion implantation before the storage node contact plugs 425 are formed. As a result, vertical channel transistors each including a drain 424, a junction region 415, and a vertical word line 421A are formed. A vertical channel is formed by the vertical word line 421A between the drain 424 and the junction region 415. The junction regions 415 become the source for the vertical channel transistors.

Storage nodes 426 are formed over the storage node contact plugs 425. The storage nodes 426 may have a cylindrical shape.

According to another embodiment, the storage nodes 426 may have a pillar shape or a concave shape. Subsequently, a dielectric layer and an upper electrode are formed.

The method for fabricating a semiconductor device in accordance with an embodiment of the present invention improves a deposition profile by forming an amorphous silicon layer at a low temperature and decreasing a deposition rate, improves the layer quality through a first thermal treatment using a silane gas and a second thermal treatment performed at a higher temperature than that of the first thermal treatment, prevents fine pores, and forms a seam-free and void-free polysilicon layer. Therefore, an active punch may be prevented from being generated when buried bit lines BBL are formed.

While the present invention has been described with respect to the specific embodiments, it will be apparent to those skilled in the art that various changes and modifications may be made without departing from the spirit and scope of the invention as defined in the following claims.

What is claimed is:

1. A method for forming a polysilicon layer, comprising:
   forming an amorphous silicon layer over a substrate;
   performing a first thermal treatment of the amorphous silicon layer to crystallize the amorphous silicon layer into a polysilicon layer while performing an implantation directly onto the amorphous silicon with a gas that includes silicon (Si); and
   performing a second thermal treatment on the polysilicon layer at a temperature higher than a temperature of the first thermal treatment.

2. The method of claim 1, wherein the gas including silicon (Si) comprises silane (SiH$_4$).

3. The method of claim 1, wherein the amorphous silicon layer is formed at a temperature ranging from approximately 300° C. to approximately 500° C.

4. The method of claim 1, wherein the first thermal treatment is performed at the same temperature that the amorphous silicon layer is formed.

5. The method of claim 1, wherein the first thermal treatment is performed at a temperature ranging from approximately 300° C. to approximately 500° C.

6. The method of claim 1, wherein the second thermal treatment is performed at a temperature ranging from approximately 600° C. to approximately 800° C.

7. The method of claim 1, wherein the second thermal treatment evaporates byproducts remaining after the first thermal treatment.

8. A method for fabricating a semiconductor device, comprising:
   forming openings in a substrate;
   forming an amorphous silicon layer filling the openings;
   performing a first thermal treatment on the amorphous silicon layer to crystallize the amorphous silicon layer into a polysilicon layer while performing an implantation directly onto the amorphous silicon with a gas that includes silicon (Si), wherein the first thermal treatment is performed at substantially the same temperature that the amorphous silicon layer is formed; and
   performing a second thermal treatment on the polysilicon layer at a temperature higher than a temperature of the first thermal treatment.

9. The method of claim 8, wherein the gas comprises silane (SiH$_4$).

10. The method of claim 8, wherein the amorphous silicon layer is formed at a temperature ranging from approximately 300° C. to approximately 500° C.

11. A method for forming buried bit lines of a semiconductor device, the method comprising:
   forming a plurality of bodies that are isolated from each other by trenches by etching a substrate;
   forming an amorphous silicon layer filling the bodies;
   crystallizing the amorphous silicon layer into a polysilicon layer by performing an implantation with a gas that includes silicon (Si) and performing a first thermal treatment;
   performing a second thermal treatment on the crystallized layer at a temperature higher than a temperature of the first thermal treatment;
   forming a first gap-fill layer filling a portion of each trench by etching the polysilicon layer;
   forming a second gap-fill layer over the first gap-fill layer so that the second gap-fill layer is disposed inside the trench to form a protrusion over each body;
   forming an etch barrier over the substrate including the protrusion;
   performing a tilt ion implantation over the etch barrier;
   selectively removing a portion of the etch barrier that is not ion-implanted; and
   forming openings that each open one sidewall of a respective body.

12. The method of claim 11, wherein the gas comprises silane (SiH$_4$).

13. The method of claim 11, wherein the amorphous silicon layer is formed at a temperature ranging from approximately 300° C. to approximately 500° C.

14. The method of claim 11, wherein the first thermal treatment is performed at the same temperature that the amorphous silicon layer is formed.

15. The method of claim 11, wherein the first thermal treatment is performed at a temperature ranging from approximately 300° C. to approximately 500° C.

16. The method of claim 11, wherein the second thermal treatment is performed at a temperature ranging from approximately 600° C. to approximately 800° C.

17. The method of claim 11, wherein the etch barrier is an undoped polysilicon layer.

18. The method of claim 11, further comprising:
   forming buried bit lines that are coupled with the openings and each fill a portion of a respective trench after the forming of the openings.

* * * * *